United States Patent
Yamada

(10) Patent No.: US 9,124,254 B2
(45) Date of Patent: Sep. 1, 2015

(54) DC-DC CONVERTER CONTROL METHOD AND DC-DC CONVERTER CONTROL CIRCUIT

(75) Inventor: Kouhei Yamada, Matsumoto (JP)

(73) Assignee: FUJI ELECTRIC CO., LTD., Kawasaki-Shi (JP)

(*) Notice: Subject to any disclaimer, the term of this patent is extended or adjusted under 35 U.S.C. 154(b) by 476 days.

(21) Appl. No.: 13/455,530

(22) Filed: Apr. 25, 2012

(65) Prior Publication Data

US 2012/0268093 A1    Oct. 25, 2012

(30) Foreign Application Priority Data

Apr. 25, 2011  (JP) ................. 2011-097453

(51) Int. Cl.
*H02M 3/156* (2006.01)
*H02M 3/157* (2006.01)
*H03K 7/08* (2006.01)

(52) U.S. Cl.
CPC ........ *H03K 7/08* (2013.01); *H02M 3/156* (2013.01)

(58) Field of Classification Search
CPC .............................. H02M 3/156; H02M 3/157
USPC .................................. 323/282, 283, 284, 285
See application file for complete search history.

(56) References Cited

U.S. PATENT DOCUMENTS

| | | | |
|---|---|---|---|
| 6,674,274 B2 * | 1/2004 | Hobrecht et al. | 323/285 |
| 6,696,821 B2 * | 2/2004 | Haraguchi et al. | 323/222 |
| 7,279,870 B2 * | 10/2007 | Hasegawa et al. | 323/224 |
| 7,772,822 B2 * | 8/2010 | Kawakami et al. | 323/283 |
| 2008/0136389 A1 * | 6/2008 | Uchimoto et al. | 323/282 |
| 2008/0180078 A1 | 7/2008 | Hiasa | |
| 2009/0201705 A1 | 8/2009 | Murata et al. | |
| 2009/0302817 A1 * | 12/2009 | Nagai | 323/282 |
| 2013/0038313 A1 * | 2/2013 | Gotoh | 323/288 |

FOREIGN PATENT DOCUMENTS

| | | |
|---|---|---|
| JP | 2001-016849 A | 1/2001 |
| JP | 2006-333616 A | 12/2006 |
| JP | 2008-187813 A | 8/2008 |
| JP | 2009-060439 A | 3/2009 |
| JP | 2009-189170 A | 8/2009 |
| JP | 2010-022186 A | 1/2010 |

* cited by examiner

*Primary Examiner* — Timothy J Dole
*Assistant Examiner* — Sisay G Tiku
(74) *Attorney, Agent, or Firm* — Rabin & Berdo, P.C.

(57) ABSTRACT

The transient response of an output voltage to a load fluctuation is improved, in a switching power source that carries out a PWM control. In a DC-DC converter wherein a switching element of an output stage is controlled by a drive signal, whose pulse width is set at a minimum value, output from a PWM signal generating circuit based on an output voltage output from an error amplifier in accordance with the difference between a feedback voltage in accordance with an output voltage of the output stage and a reference voltage, there is provided a minimum pulse width detector circuit that supplies a current to a phase compensation capacitor when the pulse width of the drive signal is at the minimum value, thus preventing the output voltage from dropping below a value corresponding to the minimum value when the load fluctuates, and improving transient response characteristics of the output voltage.

15 Claims, 4 Drawing Sheets

DC-DC CONVERTER CONTROL METHOD AND DC-DC CONVERTER CONTROL CIRCUIT

CROSS-REFERENCE TO RELATED APPLICATION

This application claims priority under 35 U.S.C. §119 from Japanese Patent Application No. 2011-097453, filed on Apr. 25, 2011, the entirety of which is incorporated herein by reference.

BACKGROUND OF THE INVENTION

1. Technical Field

The present invention relates to a DC-DC converter control method and DC-DC converter control circuit.

2. Related Art

A switching type DC-DC converter with excellent conversion efficiency, like, for example, the reference technology of FIG. 4, is widespread as a power conversion device that converts a direct current voltage into another direct current voltage.

The DC-DC converter of the reference technology shown in FIG. 4 includes a switching element SW and inductor L connected in series to an output terminal that outputs an output voltage Vout, a capacitor C connected between the output terminal and a ground potential (GND), a commutating diode D connected between a connection point of the switching element SW and inductor L and the ground potential, a PWM signal generating circuit that generates a drive signal Vdrv for controlling a turning on and off of the switching element SW by pulse width modulation (PWM), voltage dividing resistors Rd1 and Rd2 that divide the output voltage Vout, generating a feedback voltage Vd, an error amplifier, formed of a transconductance amplifier, that generates an output voltage Vea and inputs it into the PWM signal generating circuit, and a phase compensation capacitor Cc connected to an output of the error amplifier.

The error amplifier, by injecting or discharging a current in accordance with the difference between the reference voltage Vref and the feedback voltage Vd, wherein the output voltage Vout is divided by the voltage dividing resistors Rd1 and Rd2 and fed back, into or from the phase compensation capacitor Cc, generates the output voltage Vea, wherein the difference between the reference voltage Vref and feedback voltage Vd is amplified, as the voltage of the phase compensation capacitor Cc.

The PWM signal generating circuit generates a drive signal Vdrv in accordance with the output voltage Vea of the error amplifier. In the PWM signal generating circuit, a minimum value Tmin is provided for a pulse width Tdrv of the output drive signal Vdrv, and when Vea drops beyond a control range, the drive signal Vdrv having the minimum value Tmin for the pulse width Tdrv is output.

Herein, considering a case in which the load current decreases suddenly due to a load mode change, or the like, the output voltage Vout rises, and the feedback voltage Vd also rises, owing to which the output voltage Vea of the error amplifier starts to drop. Even when the pulse width Tdrv becomes as small as the minimum value Tmin, the output voltage Vea of the error amplifier continues to drop provided that the feedback voltage Vd is higher than Vref (that is, provided that the output voltage Vout exceeds a target value).

Although not shown in FIG. 4, it may be that, when operating the DC-DC converter under conditions wherein a rise of Vout is expected even when the pulse width of the drive signal Vdrv becomes the minimum value Tmin, a circuit that detects an overvoltage and skips a pulse is provided, thus keeping the rise of Vout within a predetermined range. In this kind of case, the output voltage Vea of the error amplifier stabilizes in a condition in which it has dropped to a lower limit determined by the circuit configuration of the error amplifier.

Herein, when the load current increases suddenly in a condition in which the output voltage Vea of the error amplifier has plummeted to the lower limit, Vea starts to rise again, but at this time, as time is needed until Vea reaches the PWM control range (the range in which the pulse width Tdrv spreads beyond Tmin), there is a technical problem in that the drop of the output voltage Vout increases.

With regard to a minimum on time of the switching element, the technologies of JP-A-2008-187813 and JP-A-2009-60439 are known.

In JP-A-2008-187813, there is disclosed a technology whereby, in a configuration in which the control of a switching element is switched between a PFM control and a PWM control depending on the size of a load, a minimum on period is set in the PWM control, an action turning off the switching element is carried out when the current flowing through the switching element exceeds an acceptable value after the minimum on period has elapsed, and the minimum on period is shorter than a PFM control on period.

Meanwhile, in JP-A-2009-60439, there is disclosed a method whereby, recognizing the same kind of problem with regard to the recovery of the output voltage Vea of the error amplifier, the lower limit of the output voltage of the error amplifier is restricted by adapting the circuit configuration of the error amplifier.

With this kind of circuit, however, it is not possible to obtain an advantage unless the control range of the PWM signal generating circuit is coordinated with the lower limit of the output voltage of the error amplifier. When using a differential amplifier to configure a kind of circuit wherein current is supplied to the phase compensation capacitor Cc when the output of the error amplifier drops below a predetermined voltage, it is possible to freely set the lower limit value, but when the PWM control range changes in accordance with operating conditions (for example, when Tmin is a fixed value but the switching frequency can be changed), it is difficult to respond using a method whereby Vea is given a fixed lower limit value in advance.

SUMMARY OF THE INVENTION

An object of the invention is to provide a technology whereby it is possible to realize an improvement in the transient response of an output voltage to a load fluctuation, or the like, in a switching power source that carries out a PWM control.

A first aspect of the invention provides a DC-DC converter control method including an error amplifier that amplifies and outputs the difference in voltage between a feedback voltage output from an output stage and a reference voltage, a phase compensation capacitor connected to an output of the error amplifier, and a PWM signal generating circuit wherein the pulse width of an output signal driving a switching element of the output stage changes in accordance with the output voltage of the error amplifier, the method including: setting a non-zero minimum value for the pulse width of the output signal of the PWM signal generating circuit; and supplying a current to the phase compensation capacitor, based at least partly on the pulse width of the output signal acting at (e.g., having) the non-zero minimum value.

A second aspect of the invention provides a DC-DC converter control circuit including an error amplifier that amplifies and outputs the difference in voltage between a feedback voltage output from an output stage and a reference voltage, a phase compensation capacitor connected to an output side of the error amplifier, and a PWM signal generating circuit that carries out a pulse width modulation (PWM) changing the pulse width of an output signal for a switching element of the output stage in accordance with the output voltage of the error amplifier, wherein the PWM signal generating circuit includes a minimum pulse width setting circuit that sets a non-zero minimum value of the pulse width of the output signal for the switching element, and a minimum pulse width detector circuit that supplies a current to the phase compensation capacitor based at least partly on the pulse width of the output signal acting at (e.g., having) the non-zero minimum value.

According to the invention, it is possible to provide a technology whereby it is possible to realize an improvement in the transient response of an output voltage to a load fluctuation, or the like, in a switching power source that carries out a PWM control.

DETAILED DESCRIPTION OF THE EMBODIMENTS

Figure 1:
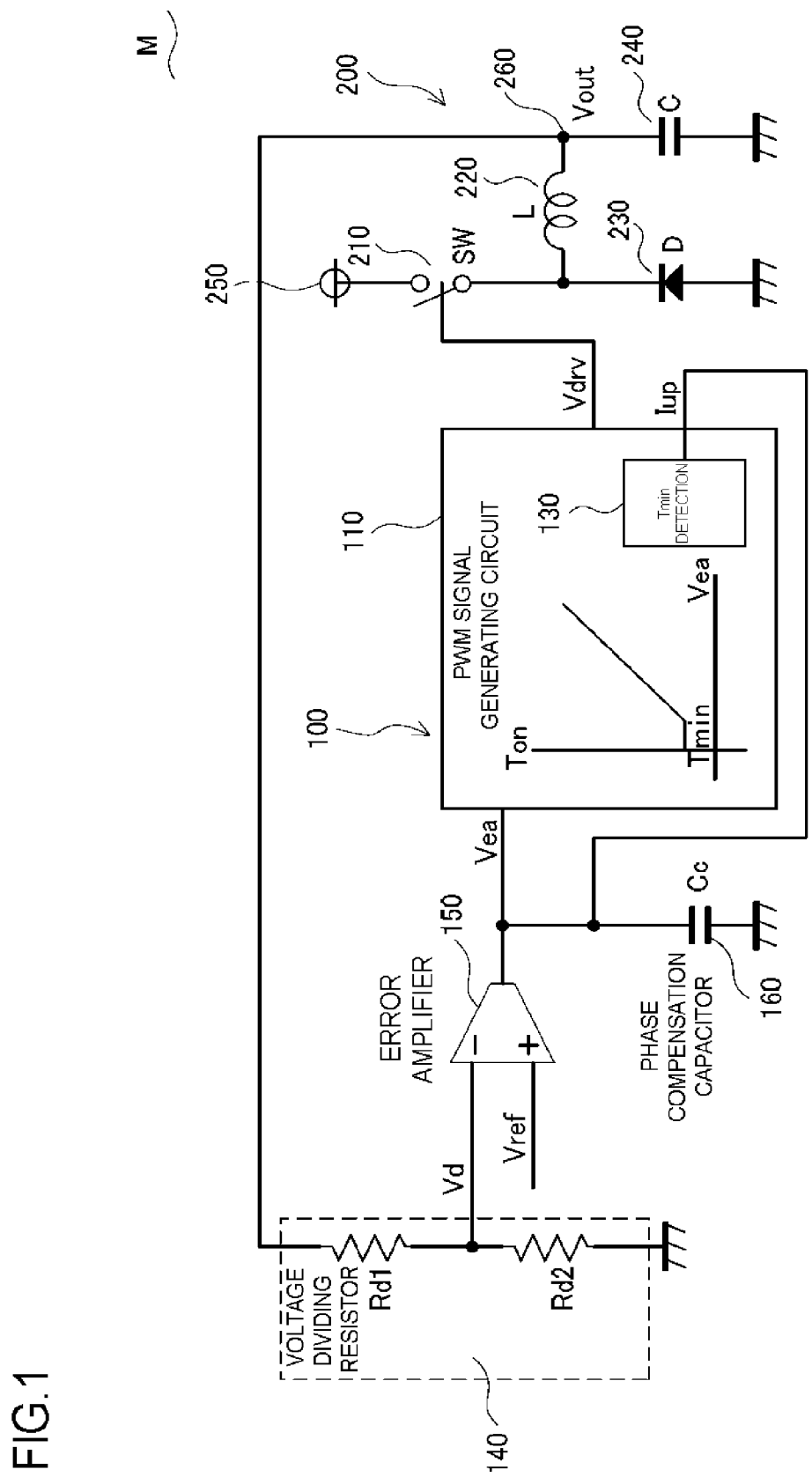
FIG. 1 is a diagram showing one example of a configuration of a DC-DC converter control circuit, which is one embodiment according to a control method and control circuit of the invention.

In this embodiment, as one mode, a switching power source that carries out a PWM control is such that current is supplied to a phase compensation capacitor when the pulse width of the PWM control is at a minimum value, thus preventing a drop in the output voltage of an error amplifier.

Because of this, it is possible to prevent the output voltage of the error amplifier dropping beyond the lower limit of a PWM signal control range, thus achieving an improvement in transient response.

Hereafter, a detailed description will be given, while referring to the drawings, of the embodiment of the invention.

FIG. 1 is a diagram showing one example of a configuration of a DC-DC converter control circuit, which is one embodiment according to a control method and control circuit of the invention.

Figure 2:
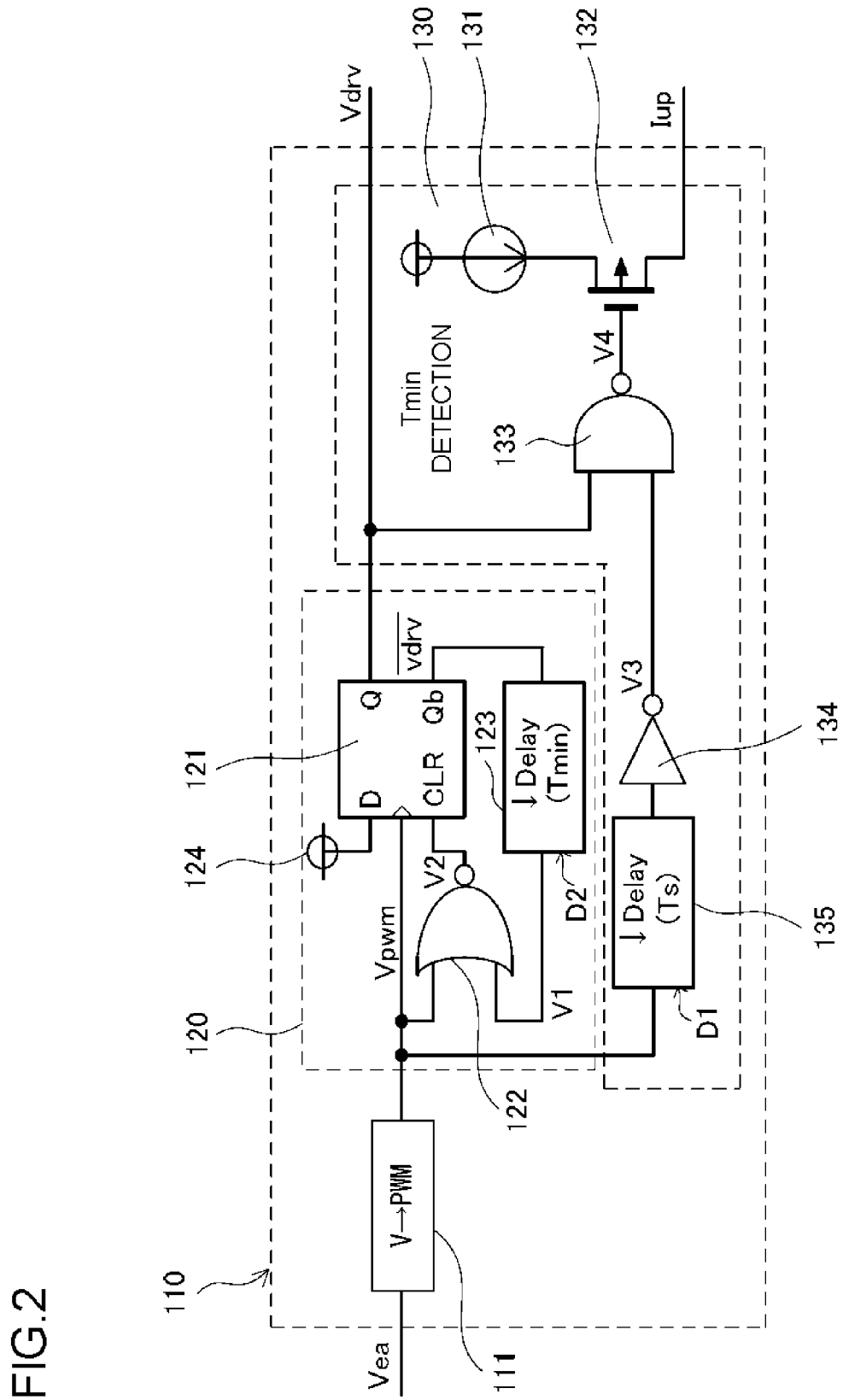
FIG. 2 is a diagram showing in further detail one portion of the configuration of the DC-DC converter control circuit of FIG. 1, which is one embodiment according to the control method and control circuit of the invention.

FIG. 2 is a diagram showing in further detail one portion of the configuration of the DC-DC converter control circuit of FIG. 1, which is one embodiment according to the control method and control circuit of the invention.

Figure 3:
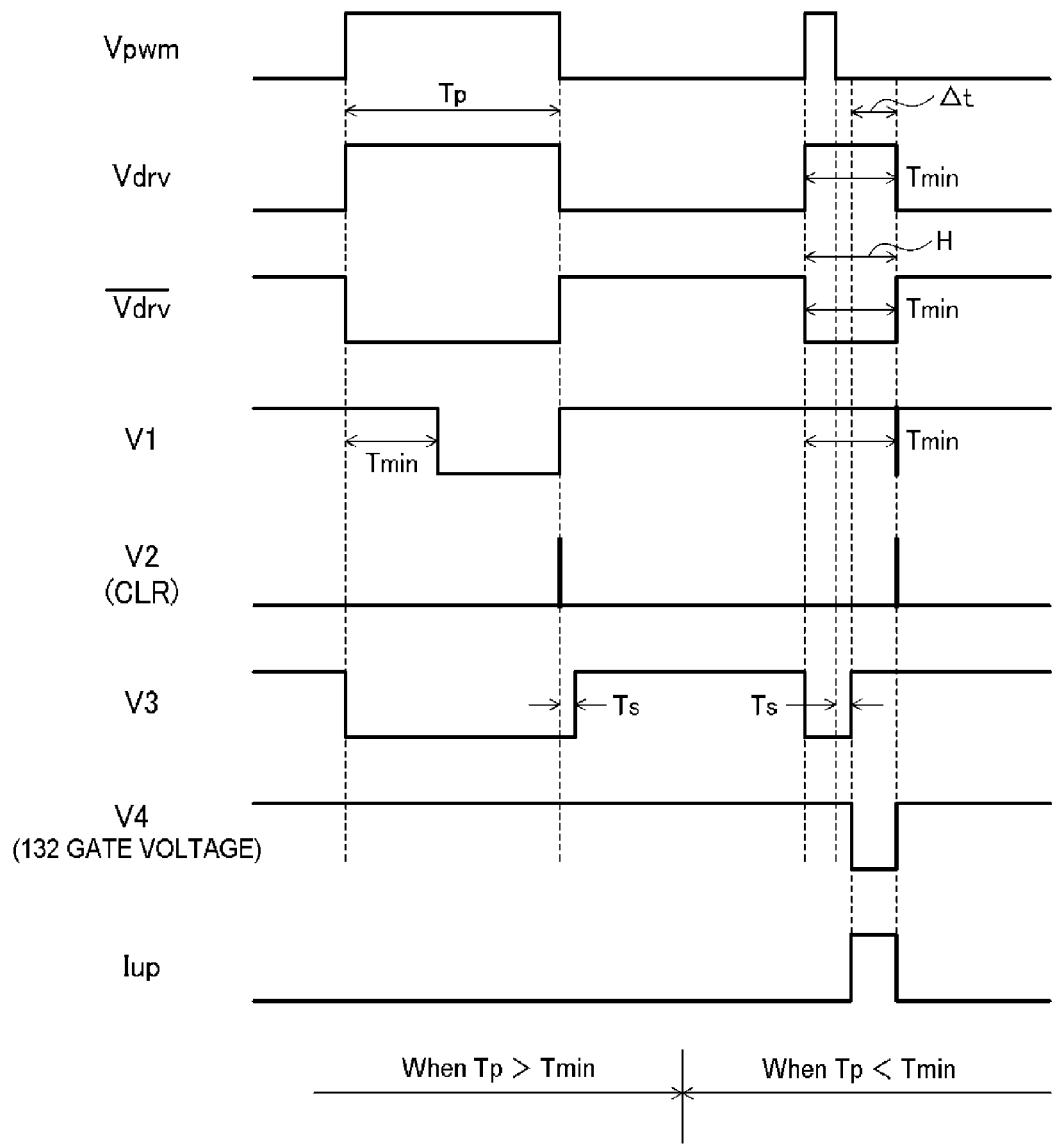
FIG. 3 is a timing chart showing one example of an action of the DC-DC converter control circuit, which is one embodiment according to the control method and control circuit of the invention.

FIG. 3 is a timing chart showing one example of an action of the DC-DC converter control circuit implementing the control method, which is one embodiment of the invention.

Figure 4:
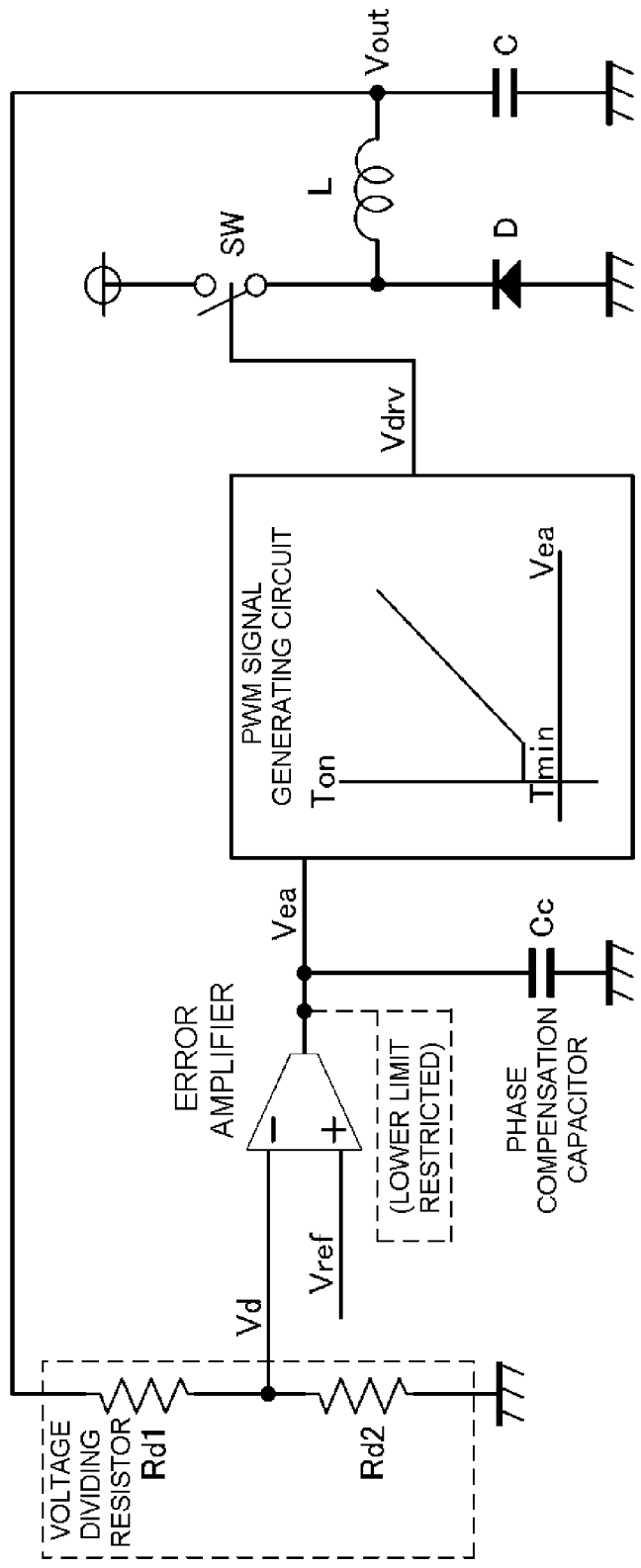
FIG. 4 is a circuit diagram of a DC-DC converter of reference technology of the invention.

A DC-DC converter M including a PWM signal generating circuit 110 of the embodiment shown in FIG. 1 differs from the reference technology of FIG. 4 in that a Tmin detector circuit is provided in the PWM signal generating circuit, and a current Iup is supplied to a phase compensation capacitor Cc when the pulse width is Tmin (that is, when the pulse width becomes smaller than Tmin in the event that a minimum pulse width Tmin is not provided).

As shown in FIG. 1, the DC-DC converter M of the embodiment includes an output stage 200 comprising a switching element 210 (SW), direct current power source 250, inductor 220 (L), commutating diode 230 (D), and capacitor 240 (C), and a control circuit 100 for controlling a turning on and off of the switching element 210 of the output stage 200.

In the case of the DC-DC converter M of the embodiment, the switching element 210 and inductor 220 of the output stage 200 are connected in series with a load, configuring a buck converter, reduce the direct current voltage of the direct current power source 250, and output it to an output terminal 260.

Also, the control circuit 100 includes the PWM signal generating circuit 110, an error amplifier 150 including a transconductance amplifier, and a phase compensation capacitor 160 (Cc).

The switching element 210 of the output stage 200, controlled on and off by a drive signal Vdrv output from the PWM signal generating circuit 110, by opening and closing a connection path between the direct current power source 250 and the inductor 220, commutating diode 230, and capacitor 240, outputs a direct current output voltage Vout in accordance with the ratio between the path being open and closed to the output terminal 260.

Also, the output voltage Vout becomes a feedback voltage Vd of the error amplifier 150 via a voltage dividing resistor 140.

The error amplifier 150 amplifies the difference between a predetermined reference voltage Vref and the feedback voltage Vd, which is the output voltage Vout of the output stage 200 divided and fed back by the voltage dividing resistor 140, and outputs an output voltage Vea to PWM signal generating circuit 110. More specifically, by injecting or discharging a current in accordance with the difference between the reference voltage Vref and feedback voltage Vd into or from the phase compensation capacitor Cc, the output voltage Vea, wherein the difference between the reference voltage Vref and feedback voltage Vd is amplified, is generated as the voltage of the phase compensation capacitor Cc.

Then, in the case of the embodiment, the PWM signal generating circuit 110 of the control circuit 100 includes a minimum pulse width detector circuit 130, to be described hereafter, wherein the minimum pulse width detector circuit 130 can supply the current Iup to the phase compensation capacitor Cc of the error amplifier 150 at a kind of timing to be described hereafter.

Next, referring to FIG. 2, one example of an internal configuration of the PWM signal generating circuit 110 configuring the control circuit 100 of the DC-DC converter M of the embodiment will be described in further detail.

The PWM signal generating circuit 110 configuring the control circuit 100 of the embodiment includes a PWM converter 111, which converts the output voltage Vea of the error amplifier 150 into a PWM original signal (pulse width modulated original signal) Vpwm, and a minimum pulse width setting circuit 120 and the minimum pulse width detector circuit 130 as a circuit that, when the pulse width of the PWM original signal Vpwm is smaller than the minimum value Tmin, sets the minimum value Tmin by extending the pulse width, and injects current into the phase compensation capacitor Cc.

Herein, as the PWM original signal Vpwm output from the PWM converter 111 is a signal for which the minimum value Tmin, which is the minimum on time, has not yet been set, the minimum value thereof is zero. Specifically, the PWM original signal Vpwm, being a signal generated by comparing the output voltage (error signal) Vea of the error amplifier 150 and an unshown carrier signal Vcary formed of a triangular wave or sawtooth wave, is a signal that is at a high level when Vea>Vcary.

When the output voltage Vea of the error amplifier 150 is lower than the minimum value of Vcary, the PWM original signal Vpwm remains at a low level, and the on time is zero.

The minimum pulse width setting circuit 120 includes a delay circuit 123 (D2), whose fall delay time is the minimum value Tmin, a D flip-flop 121 (D-FF) having an asynchronous reset function, and a NOR (negative logical sum) gate 122.

The delay circuit 123 (D2) with the fall delay time Tmin, being a circuit that delays only the leading edge (fall) of an input (in this case, an inverse signal of the drive signal Vdrv), is a circuit that does not delay a rise. The delay time Tmin of the delay circuit 123 (D2) corresponds to the minimum pulse width (minimum value Tmin).

Then, a D input of the D-FF is fixed at a high level by a fixed input 124, and by resetting the D-FF by an output Q of the D-FF being set at a high level by the rising edge of the PWM original signal Vpwm (Qb, the inverse of Q, is at a low level, which is the inverse logic of Vdrv), and a voltage V2 indicating the later of the fall of an output V1 of the delay circuit 123 (D2) and the fall of the PWM original signal Vpwm being a CLR input of the D-FF, it is possible to realize an on-off action controlling the switching element 210 with the drive signal Vdrv, whose pulse width is of a value in accordance with the output voltage Vea, and which has the minimum value Tmin.

Furthermore, in the case of the embodiment, the minimum pulse width detector circuit 130 that controls the current Iup of the PWM signal generating circuit 110 includes a fall delay circuit 135 (D1) that delays the trailing edge (the fall) of Vpwm by a short time (of an extent slightly longer than the delay time of a logic gate of the D-FF, and the like, of the minimum pulse width setting circuit 120), an inverter 134 that inverts the output of the delay circuit 135 (D1), a NAND (negative logical product) gate 133 that obtains the inverse of the logical product of an output V3 of the inverter 134 and the drive signal Vdrv, and a P-channel MOSFET 132 that conducts in accordance with the output of the NAND gate 133, outputting the current.

Then, the P-channel MOSFET 132 controls a turning on and off of an action charging the phase compensation capacitor 160 (Cc) with the current Iup by turning on and off a fixed current from a fixed current source 131.

Next, referring to FIG. 3 and the like, a description will be given of one example of a working of the control circuit including the PWM signal generating circuit 110, error amplifier 150, phase compensation capacitor 160, voltage dividing resistor 140, and the like, in the DC-DC converter M of the embodiment.

In the PWM signal generating circuit 110, when a pulse width Tp of the PWM original signal Vpwm output from the PWM converter 111 is larger than the predetermined minimum value Tmin (the left half of FIG. 3), the output V1 of the delay circuit 123 (D2) is already at a low level at a point at which Vpwm changes to a low level, meaning that the voltage V2 changes to a high level, the D-FF is reset, and the drive signal Vdrv, which is the output of the PWM signal generating circuit 110, immediately changes to a low level owing to the delay of the logic gate of the D-FF and the like.

Because of this, it does not happen in the minimum pulse width detector circuit 130 that a signal (the output V3) wherein Vpwm is delayed and inverted by the delay circuit 135 (D1) and the drive signal Vdrv are both at a high level, the P-channel MOSFET 132 does not conduct (come on), and no charging of the phase compensation capacitor 160 (Cc) with the current Iup is carried out.

Meanwhile, when the pulse width Tp of Vpwm is smaller than the minimum value Tmin (the right half of FIG. 3), the drive signal Vdrv does not change to a low level until the output V1 of the delay circuit 123 (D2) in the minimum pulse width setting circuit 120 changes to a low level (that is, until the voltage V2, which is the reset input (CLR) of the D-FF, changes to a high level), even when Vpwm changes to a low level.

Then, on a time Tmin elapsing from Vpwm rising, the D-FF is reset by the output V1 of the delay circuit 123 (D2) changing to a low level, and the drive signal Vdrv changes to a low level. Consequently, when the pulse width Tp of Vpwm is smaller than the minimum value Tmin, the drive signal Vdrv always maintains a high level for the period of the minimum value Tmin. That is, the minimum pulse width Tmin is set for the drive signal Vdrv.

Because of this, when the pulse width Tp of Vpwm is smaller than the minimum pulse Tmin of the drive signal Vdrv, the P-channel MOSFET 132 conducts for a period Δt until the drive signal Vdrv changes to a low level (that is, for a period in which a pulse width H of the drive signal Vdrv is extended to the minimum value Tmin), and the current Iup is supplied to the phase compensation capacitor 160 Cc.

As a result of this, the output voltage Vea of the error amplifier 150 no longer drops below a voltage at which the pulse width of Vpwm becomes the minimum value Tmin.

Because of this, when there is an increase in the pulse width of the drive signal Vdrv needed due to an increase in the load current, it is possible to minimize the increase in width when the output voltage Vea of the error amplifier 150 increases to a commensurate value, and to keep the time needed for this to a minimum, and thus possible to keep the drop in the output voltage Vout of the DC-DC converter M to a minimum.

Because of this, for example, it is possible to suppress a fluctuation in output voltage when the load connected to the output terminal 260 of the DC-DC converter M transiently fluctuates widely.

That is, according to the DC-DC converter M of the embodiment, an advantage is obtained in that the output voltage Vea of the error amplifier 150 of the control circuit 100 is prevented from dropping below the lower limit of the PWM control range stipulated by the minimum value Tmin, and the transient response of the DC-DC converter M is improved.

It will be apparent to one skilled in the art that the manner of making and using the claimed invention has been adequately disclosed in the above-written description of the exemplary embodiments taken together with the drawings. Furthermore, the foregoing description of the embodiments according to the invention is provided for illustration only, and not for limiting the invention as defined by the appended claims and their equivalents.

It will be understood that the above description of the exemplary embodiments of the invention are susceptible to various modifications, changes and adaptations, and the same are intended to be comprehended within the meaning and range of equivalents of the appended claims.

What is claimed is:

1. A method of controlling a DC-DC converter including an error amplifier that amplifies and outputs a difference in voltage between a feedback voltage output from an output stage and a reference voltage, a phase compensation capacitor connected to an output of the error amplifier, and a PWM (pulse width modulation) signal generating circuit that outputs an output signal driving a switching element of the output stage, the output signal having a pulse width that changes in accordance with an output voltage of the error amplifier, the method comprising:
setting a non-zero minimum value for the pulse width of the output signal of the PWM signal generating circuit; and
supplying a current to the phase compensation capacitor, in response to detecting that the pulse width of the output signal has become less than the non-zero minimum value.

2. A DC-DC converter control circuit, comprising:
an error amplifier that amplifies and outputs a difference in voltage between a feedback voltage output from an output stage and a reference voltage;
a phase compensation capacitor connected to an output side of the error amplifier; and
a PWM signal generating circuit that carries out a pulse width modulation (PWM) that changes a pulse width of an output signal for a switching element of the output stage in accordance with the amplified difference voltage output by the error amplifier, wherein
the PWM signal generating circuit includes:
a minimum pulse width setting circuit that sets a non-zero minimum value of the pulse width of the output signal for the switching element; and
a minimum pulse width detector circuit that supplies a current to the phase compensation capacitor in response to detecting that the pulse width of the output signal has become less than the non-zero minimum value.

3. The DC-DC converter control circuit according to claim 2, further comprising:
a PWM converter that generates a pulse width modulated original signal with a minimum pulse width of zero based on the output of the error amplifier, wherein
the minimum pulse width setting circuit generates the output signal for the switching element by setting a non-zero minimum value for the pulse width modulated original signal, and
the minimum pulse width detector circuit, based at least partly on a pulse output of the output signal for the switching element continuing after a pulse output of the pulse width modulated original signal is finished, supplies a current to the phase compensation capacitor until the pulse output of the output signal for the switching element is finished.

4. The DC-DC converter control circuit according to claim 3, wherein the minimum pulse width detector circuit includes:
an open-close element that controls a turning on and off of the supply of the current to the phase compensation capacitor;
a first delay circuit that generates a signal delaying a trailing edge of the pulse width modulated original signal;
an inverter that inverts an output of the first delay circuit; and
a negative logical product circuit that controls the turning on and off of the open-close element with a negative logical product of the inverted output of the inverter and the output signal for the switching element.

5. The DC-DC converter control circuit according to claim 2, wherein
the minimum pulse width detector circuit includes:
an open-close element that controls a turning on and off of the supply of the current to the phase compensation capacitor;
a first delay circuit that generates a signal delaying a trailing edge of the pulse width modulated original signal;
an inverter that inverts an output of the first delay circuit; and
a negative logical product circuit that controls the turning on and off of the open-close element with a negative logical product of the inverted output of the inverter and the output signal for the switching element.

6. The DC-DC converter control circuit according to claim 2, wherein the minimum pulse width setting circuit includes:
a D flip-flop having the pulse width modulated original signal as a clock input and a Q output as the output signal for the switching element;
a second delay circuit that delays a leading edge of an inverted Q output of the D flip-flop by the non-zero minimum value; and
a negative logical sum circuit causing a negative logical sum of an output of the second delay circuit and the pulse width modulated original signal to be a reset input of the D flip-flop.

7. The DC-DC converter control circuit according to claim 2, wherein the error amplifier includes a transconductance amplifier.

8. A control circuit, comprising:
a PWM (pulse width modulation) signal generating circuit configured to, in response to an input pulse having a pulse width smaller than a predetermined minimum value, generate an output pulse extended to have the predetermined minimum value;
the PWM signal generating circuit comprising a minimum pulse width setting circuit, the minimum pulse width setting circuit including a delay circuit having a delay time corresponding to the predetermined minimum value;
the PWM signal generating circuit further configured to generate a drive signal, the drive signal including the output pulse extended to have the predetermined minimum value, wherein the drive signal is coupled to a switching element configured to control an output stage of the control circuit.

9. The control circuit of claim 8, the PWM signal generating circuit further comprising a minimum pulse width detector circuit coupled to an output of the minimum pulse width setting circuit, and configured to, based at least partly on the output of the minimum pulse width setting circuit, output a current.

10. The control circuit of claim 9, further comprising a capacitor coupled to the minimum pulse width detector circuit at a node that outputs the current.

11. The control circuit of claim 9, the minimum pulse width detector circuit comprising a switching device configured to turn a fixed current from a fixed current source on and off to output the current.

12. The control circuit of claim 11, wherein the switching device is configured to turn the fixed current on and off based at least partly on the drive signal generated by the minimum pulse width setting circuit, the drive signal including the output pulse extended to have the predetermined minimum value.

13. The control circuit of claim 12, wherein the switching device is further configured to turn the fixed current on and off based at least partly on an output of a fall delay circuit that delays a trailing edge of a pulse width modulated signal, at least one pulse of the pulse width modulated signal corresponding to the input pulse of the PWM signal generating circuit having the pulse width smaller than the predetermined minimum value.

14. The control circuit of claim 8, further comprising an error amplifier coupled to the PWM signal generating circuit and outputting an amplified difference signal, the difference signal corresponding to a difference between a feedback voltage output from an output stage of the control circuit and a reference voltage.

15. The control circuit of claim 14, further comprising a PWM converter configured to convert the amplified difference signal into a pulse width modulated signal, at least one pulse of the pulse width modulated signal corresponding to the input pulse of the PWM signal generating circuit having the pulse width smaller than the predetermined minimum value.

* * * * *